US011817374B2

(12) United States Patent
Ho et al.

(10) Patent No.: US 11,817,374 B2
(45) Date of Patent: Nov. 14, 2023

(54) ELECTRONIC DEVICE WITH EXPOSED TIE BAR

(71) Applicant: Texas Instruments Incorporated, Dallas, TX (US)

(72) Inventors: Chih-Chien Ho, New Taipei (TW); Bo-Hsun Pan, New Taipei (TW); Yuh-Harng Chien, New Taipei (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/229,955

(22) Filed: Apr. 14, 2021

(65) Prior Publication Data

US 2022/0336331 A1    Oct. 20, 2022

(51) Int. Cl.
*H01L 23/495* (2006.01)
*H01L 21/50* (2006.01)
*H01L 21/56* (2006.01)
*H01L 23/00* (2006.01)

(52) U.S. Cl.
CPC .......... *H01L 23/4951* (2013.01); *H01L 21/50* (2013.01); *H01L 23/49541* (2013.01); *H01L 23/49551* (2013.01); *H01L 23/49575* (2013.01); *H01L 24/49* (2013.01); *H01L 24/85* (2013.01); *H01L 2924/181* (2013.01)

(58) Field of Classification Search
CPC ... H01L 2924/181; H01L 24/49; H01L 24/85; H01L 23/4951; H01L 23/49551; H01L 23/49575; H01L 23/49541; H01L 21/50
See application file for complete search history.

(56) References Cited

U.S. PATENT DOCUMENTS

| 3,629,668 | A | * | 12/1971 | Hingorany | ........ | H01L 23/49541 |
| | | | | | | 174/557 |
| 5,411,920 | A | * | 5/1995 | Shibata | ............. | H01L 23/49541 |
| | | | | | | 29/827 |
| 6,664,133 | B2 | * | 12/2003 | Abe | ................... | H01L 23/49541 |
| | | | | | | 438/111 |
| 9,305,869 | B1 | * | 4/2016 | Zhang | ............... | H01L 23/49551 |
| 9,627,299 | B1 | * | 4/2017 | Flessner | ............ | H01L 23/49568 |
| 10,854,538 | B2 | | 12/2020 | Ko et al. | | |
| 2017/0221804 | A1 | * | 8/2017 | Taguchi | ............ | H01L 23/49517 |
| 2018/0040487 | A1 | * | 2/2018 | Takahashi | ......... | H01L 23/49503 |

(Continued)

FOREIGN PATENT DOCUMENTS

WO    WO-2017002268 A1 *  1/2017  ............. H01L 21/56

*Primary Examiner* — Alonzo Chambliss

(74) *Attorney, Agent, or Firm* — Yudong Kim; Frank D. Cimino

(57) ABSTRACT

A packaged electronic device has a package structure, first leads, second leads and a tie bar. The package structure has a first side, a second side, a third side, a fourth side, a fifth side and a sixth side, the second side spaced from the first side along a first direction, the fourth side spaced from the third side along an orthogonal second direction, and the sixth side spaced from the fifth side along an orthogonal third direction. The first leads extend outward in a first plane of the second and third directions from respective portions of the third side, the second leads extend outward in the first plane from respective portions of the fourth side, and the tie bar is exposed along the fifth side in a second plane of the second and third directions, the second plane between the first plane and the first side.

23 Claims, 11 Drawing Sheets

(56) References Cited

U.S. PATENT DOCUMENTS

2019/0177159 A1\* 6/2019 Kaija .................... H01L 23/552
2019/0295939 A1 9/2019 Ko et al.
2021/0020549 A1 1/2021 Chien et al.

\* cited by examiner

ELECTRONIC DEVICE WITH EXPOSED TIE BAR

BACKGROUND

The manufacture of integrated circuits (ICs) and other packaged electronic devices includes packaging. Molding processes are sometimes used to form a molded enclosure of an electronic device, for example, after wire bonding and before individual devices are separated from a starting lead frame. Mold flash may occur where a manufacturing mold has openings that allow liquid molding material to leak. Mold flash near bottom side thermal pads and leads can inhibit proper soldering to a host printed circuit board (PCB).

SUMMARY

In one aspect, a packaged electronic device includes a package structure, first leads, second leads and a tie bar. The package structure has six sides with a second side spaced from a first side along a first direction, a fourth side spaced from a third side along a second direction orthogonal to the first direction, and a sixth side spaced from a fifth side along a third direction orthogonal to the first and second directions. First leads extend outward in a first plane of the second and third directions from respective portions of the third side, and second leads extend outward in the first plane from respective portions of the fourth side. The tie bar is exposed along the fifth side in a second plane of the second and third directions, the second plane being spaced from the first plane along the first direction between the first plane and the first side.

In another aspect, a lead frame includes a conductive structure with multiple sections. The respective sections include a die attach pad, first leads, second leads, a connecting bar and a tie bar. The die attach pad has opposite sides spaced from one another along a first direction and extending in a die attach pad plane of second and third directions. The first leads are spaced outward along the second direction from one lateral side of the die attach pad in a first plane of the second and third directions being spaced from the die attach pad plane along the first direction. The second leads are spaced outward along the second direction from an opposite lateral side of the die attach pad in the first plane. The connecting bar extends between the first plane and a second plane spaced from and between the die attach pad plane and the first plane. The tie bar extends between the die attach plane and the second plane and connecting the die attach pad to the connecting bar.

In a further aspect, a method of manufacturing a packaged electronic device includes attaching a semiconductor die to a die attach pad of a lead frame and electrically connecting conductive features of the semiconductor die to leads of the lead frame. The method also includes performing a molding process that compresses and deforms a connecting bar of the lead frame, the molding processes forming a package structure that encloses the semiconductor die and interior portions of the leads.

DETAILED DESCRIPTION

Figure 1:
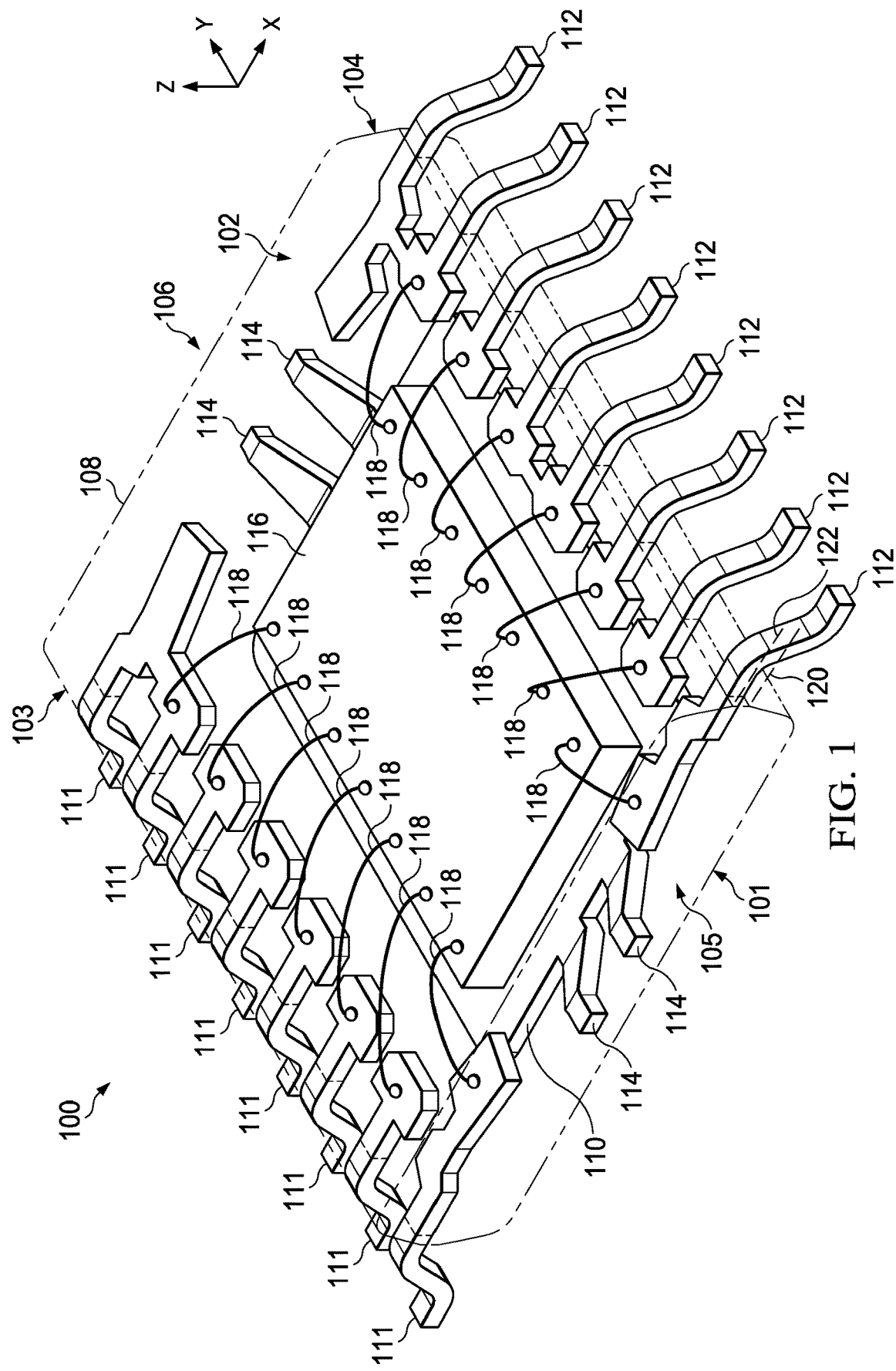
FIG. 1 is a top perspective view of a packaged electronic device.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1A:
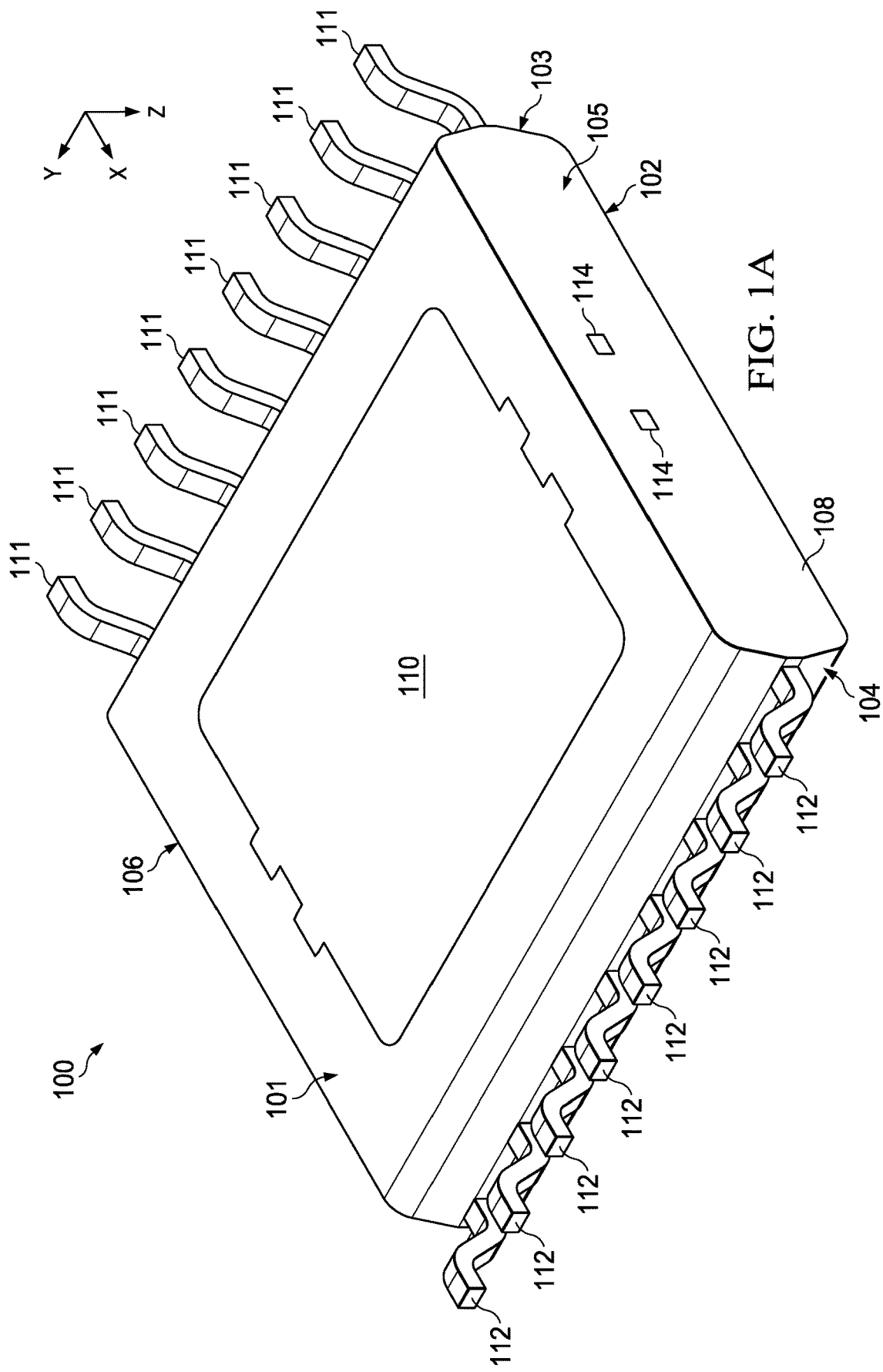
FIG. 1A is a bottom view of the packaged electronic device of FIG. 1.
Figure 1B:
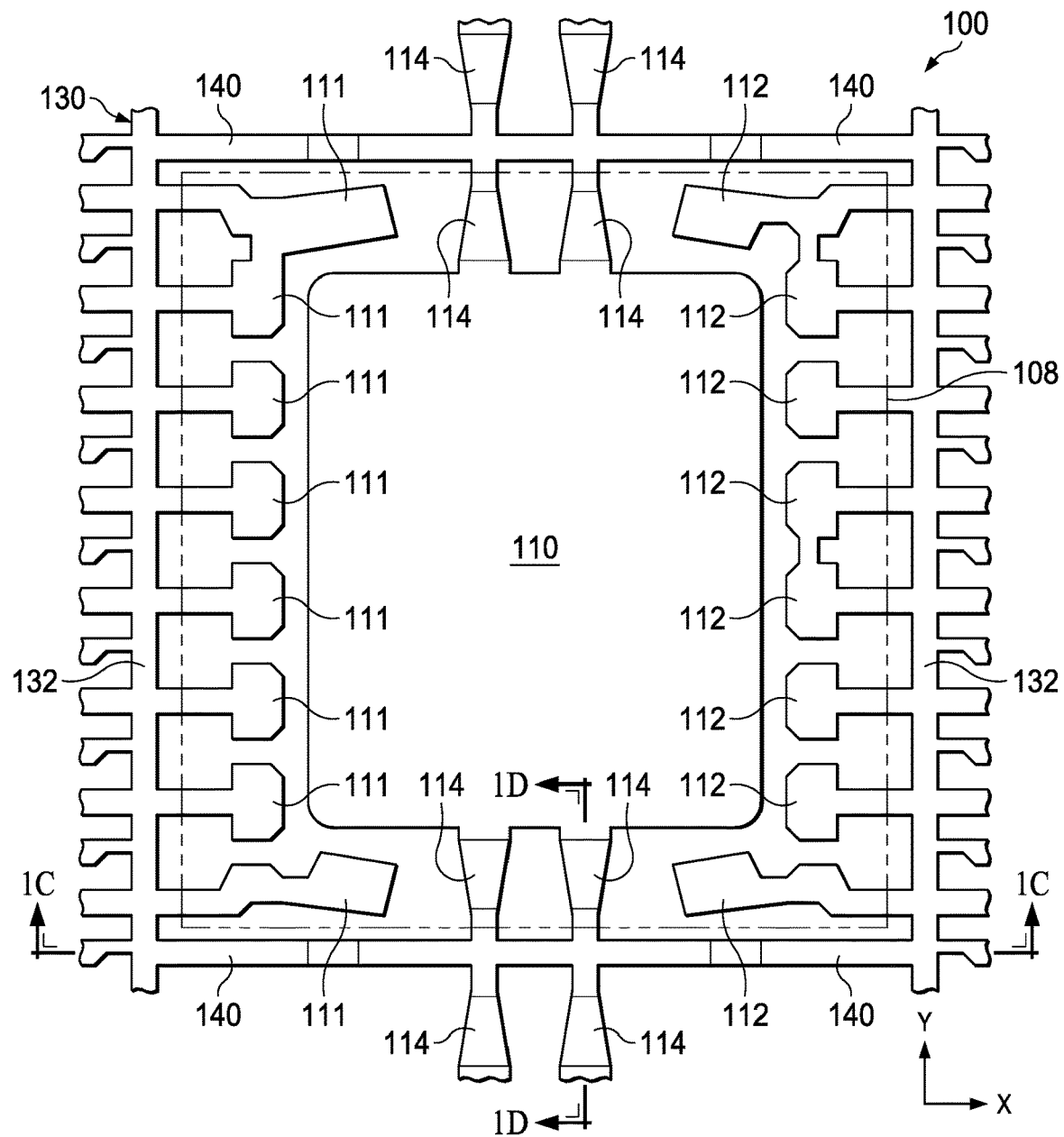
FIG. 1B is a top view of a lead frame of the packaged electronic device of FIGS. 1 and 1A.
Figure 1C:
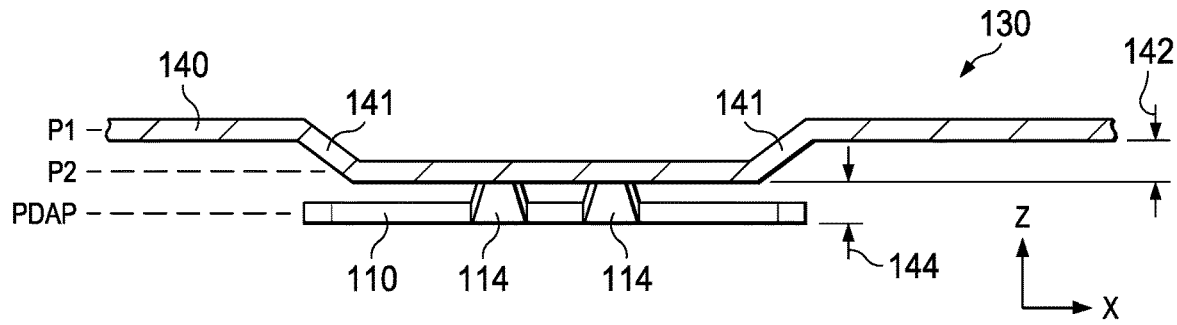
FIG. 1C is a partial side elevation view taken along line 1C-1C in FIG. 1B.
Figure 1D:
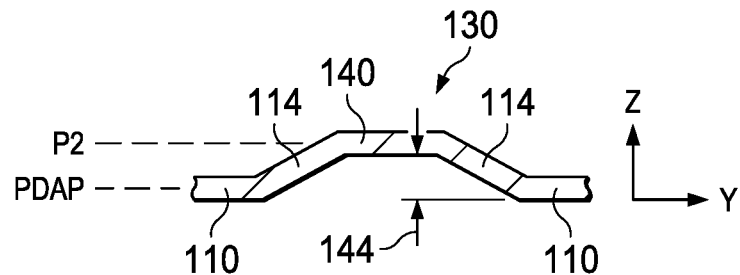
FIG. 1D is a partial side elevation view taken along line 1D-1D in FIG. 1B.

FIGS. 1A-1D show a packaged electronic device 100 with exposed tie bars, a bottom side thermal pad and a compressed and deformed connecting bar to mitigate mold flash during fabrication. FIGS. 1 and 1A show respective top and bottom perspective views of the packaged electronic device 100. FIG. 1B shows a top view of a lead frame of the packaged electronic device 100, FIG. 1C shows a partial side elevation view taken along line 1C-1C in FIG. 1B and FIG. 1D shows a partial side elevation view taken along line 1D-1D in FIG. 1B.

The packaged electronic device 100 includes a package structure 108 with a first side 101 (e.g., the bottom side in the illustrated orientation of FIG. 1) and an opposite second side 102 (e.g., top side) spaced apart from the first side 101 along a first direction (e.g., the vertical direction Z in FIGS. 1-1D. The packaged electronic device 100 also includes a third side 103 (e.g., the lateral lower left side in FIG. 1) and an opposite fourth side 104 (e.g., the upper right side in FIG. 1) spaced apart from the third side 103 along a second direction (e.g., the X direction), where the second direction X is orthogonal to the first direction Z. The packaged electronic device 100 in the illustrated example is generally rectangular and includes lateral ends formed by a fifth side 105 and a sixth side 106. The sixth side 106 is spaced apart from the fifth side 105 along a third direction Y that is orthogonal to the respective first and second directions Z and X.

The packaged electronic device 100 has generally flat or planar bottom and top sides 101 and 102. The lateral sides 103-106 can be tapered from a mold parting line to facilitate ejection from a mold during fabrication. In other implementations, one or more of the lateral sides 103-106 can be flat or planar and/or one or both sides 101 and 102 can be non-planar. The packaged electronic device 100 includes a conductive pad 110 having a first (e.g., bottom) side exposed along the first side 101. The conductive pad 110 in one example is a die attach pad that supports a semiconductor die. The conductive pad 110 in this example also serves as a thermal pad to conduct heat away from the supported semiconductor die. The packaged electronic device 100 has a set of gull wing first leads 111 that extend outward and down from the third side 103, and a set of gull wing second leads 112 that extend outward and down from the fourth side 104.

The packaged electronic device 100 includes tie bars 114 exposed along respective portions of the fifth side 105 and the sixth side 106 of the package structure 108. In the illustrated example, the tie bars 114 are connected to the conductive pad 110. In other implementations, the packaged electronic device 100 includes a single tie bar 114 exposed along a portion of the fifth side 105. In another example, the exposed tie bar 114 or one or more of multiple tie bars 114 is/are spaced from the conductive pad 110. The packaged electronic device 100 includes a semiconductor die 116 mounted to the top or second side of the conductive pad 110. Conductive features (e.g., bond pads) of the semiconductor die 116 are electrically coupled to respective ones or groups of the first and/or second leads 111, 112.

In the illustrated example, conductive bond wires 118 electrically couple select bond pads of the semiconductor die 116 to respective ones or groups of the first and/or second leads 111, 112 as shown in FIG. 1. The bond wires 118, the semiconductor die 116 and interior portions of the conductive pad 110, the leads 111 and 112 and the tie bars 114 are enclosed by the package structure 108.

As shown in FIGS. 1C and 1D, the first leads 111 extend outward in a first X-Y plane P1 from respective portions of the third side 103. As seen in FIGS. 1, 1A and 1B, the first leads 111 are spaced from one another along the third direction Y. The second leads 112 extend outward in the first plane P1 from respective portions of the fourth side 104 of the package structure 108, and are spaced from one another along the third direction Y. In the illustrated example, the leads 111 and 112 are ultimately formed into gull wing shapes that exit the respective sides 103 and 104 of the package structure 108 along the first plane P1 and then extend downward toward and then outward again as shown in FIGS. 1 and 1A. In another implementation (not shown), the leads 111 and 112 have different shapes.

As shown in FIGS. 1C and 1D, the tie bars 114 are exposed along the respective fifth and sixth sides 105 and 106 in a second X-Y plane P2. The second plane P2 is spaced from and below the first plane P1 along the first direction Z, as shown in FIG. 1C, and the second plane P2 is located between the first plane P1 and the first side 101 of the package structure 108. As shown in FIG. 1C, the conductive pad 110 (e.g., the die attach pad) extends in a die attach pad plane PDAP of second and third directions X and Y.

As shown in FIG. 1, the example packaged electronic device 100 has a molded package structure 108 with tapered sides 103-106 each having upper and lower tapered portion. The tapered portions meet or join along a mold parting line of the package structure 108, including lines 120 and 122 in FIG. 1. In this example, the tapered portions of the respective sides 103-106 extend to a generally flat parting line that extends along the first direction Z from the line 120 to the line 122. In another example (not shown), the mold parting line can be in a single X-Y plane that directly joins the tapered portions of the respective sides 103-106. The second plane P2 is spaced from the mold parting line 120, 122 of the package structure 108 along the first direction Z, and the second plane P2 is between the mold parting line 120, 122 and the first side 101. The first leads 111 and the second leads 112 extend outward from the respective sides 103 and 104 of the package structure 108 along the X-Y plane P2 of the mold parting line 120, 122.

FIG. 1B shows a top view of a lead frame 130 of the packaged electronic device 100, FIG. 1C shows a partial side view taken along line 1C-1C in FIG. 1B and FIG. 1D shows a partial side elevation view taken along line 1D-1D in FIG. 1B. The lead frame 130 includes a conductive structure, such as or including aluminum, copper or other conductive metal. The conductive structure of the lead frame 130 has multiple sections allowing concurrent fabrication of multiple packaged electronic devices in an array. The respective sections include a die attach pad (e.g., the conductive pad 110 described above) having opposite sides spaced from one another along the first direction Z. The conductive pad 110 extends in the die attach pad X-Y plane PDAP. In each section of the lead frame 130 also include the respective first leads 111 spaced outward along the second direction X from one lateral side of the die attach pad 110. The first leads 111 extend in the first X-Y plane P1, and the first plane P1 is spaced from the die attach pad plane PDAP along the first direction Z. The respective sections of the lead frame 130 also include the second leads 112 spaced outward along the second direction X from an opposite lateral side of the die attach pad 110, and the second leads 112 also extend in the first plane P1.

The conductive structure of the lead frame 130 also includes one or more support arms 132 that extend in the first plane P1, as well as one or more dual level connecting bars 140. As shown in FIG. 1B, the support arms 132 connect the first and second leads 111, 112 to the connecting bar 140. The individual connecting bars 140 extend between the first X-Y plane P1 and the second X-Y plane P2. As best shown in FIGS. 1B and 1C, the connecting bars 140 individually include a support portion that extends in the first plane P1 and connects to the support arm 132, as well as a base portion that extends in the second plane P2 and connects to the tie bar 114, and an angled portion 141 (FIG. 1C) that extends between the first plane P1 and the second plane P2 and connects the support portion to the base portion. As further shown in FIGS. 1B and 1D, the individual tie bars 114 extend between the die attach plane PDAP and the second plane P2 and connect the respective die attach pad 110 to the respective base portion of the connecting bar 140. The tie bars 114 shown in the section view of FIG. 1D individually include a first end connected to the base portion of the connecting bar 140 in the second plane P2 and a second end connected to the die attach pad 110 in the die attach plane PDAP.

The dual level structures of the connecting bars 140 and of the tie bars 114 provide a multilevel spring structure that opposes mold closing forces along the first direction Z during fabrication to mitigate mold leaking and mold flash, for example, to reduce or eliminate mold flash on the lower side of the conductive (e.g., die attach) pad 110. As shown in FIGS. 1C and 1D, in one example the bottom side of the support portion of the connecting bar 140 is spaced from the bottom side of the base portion along the first direction Z by a spacing distance 142, for example, 0.25 mm. As shown in FIGS. 1C and 1D, the bottom side of the base portion of the connecting bar 140 is spaced from the bottom side of the conductive (e.g., die attach) pad 110 along the first direction Z by a spacing distance 144, for example, 0.2 mm. In this example, the thicknesses of the features in the planes P1, P2 and PDAP are each 0.150 mm along the first direction Z, and the spacing along the first direction Z between the bottom side of the support portion of the connecting bar 140 and the bottom side of the conductive pad 110 (e.g., 0.45 mm) is less than a first direction height of a mold cavity used to form the molded package structure 108. In this example, the closure of the mold (e.g., bringing upper and lower portions of the mold together) compresses and deforms all or portions of the connecting bar 140 of the lead frame 130. In one example, mold closure compresses and deforms all or portions of the tie bars 114, alone or in combination with compression and deformation of all or portions of the connecting bar 140.

Referring now to FIGS. 2-10, FIG. 2 shows a method 200 of fabricating a packaged electronic device and FIGS. 3-10 show side views of the packaged electronic device 100 undergoing fabrication processing according to the method 200. In one example, the semiconductor device fabrication uses standard processing steps with a modified starting lead frame 130 and molding process to form the package structure 108. The method 200 begins in FIG. 2 with die fabrication and die singulation at 202, for example, to produce the semiconductor die 116 as shown in FIG. 1 above.

Figure 3:
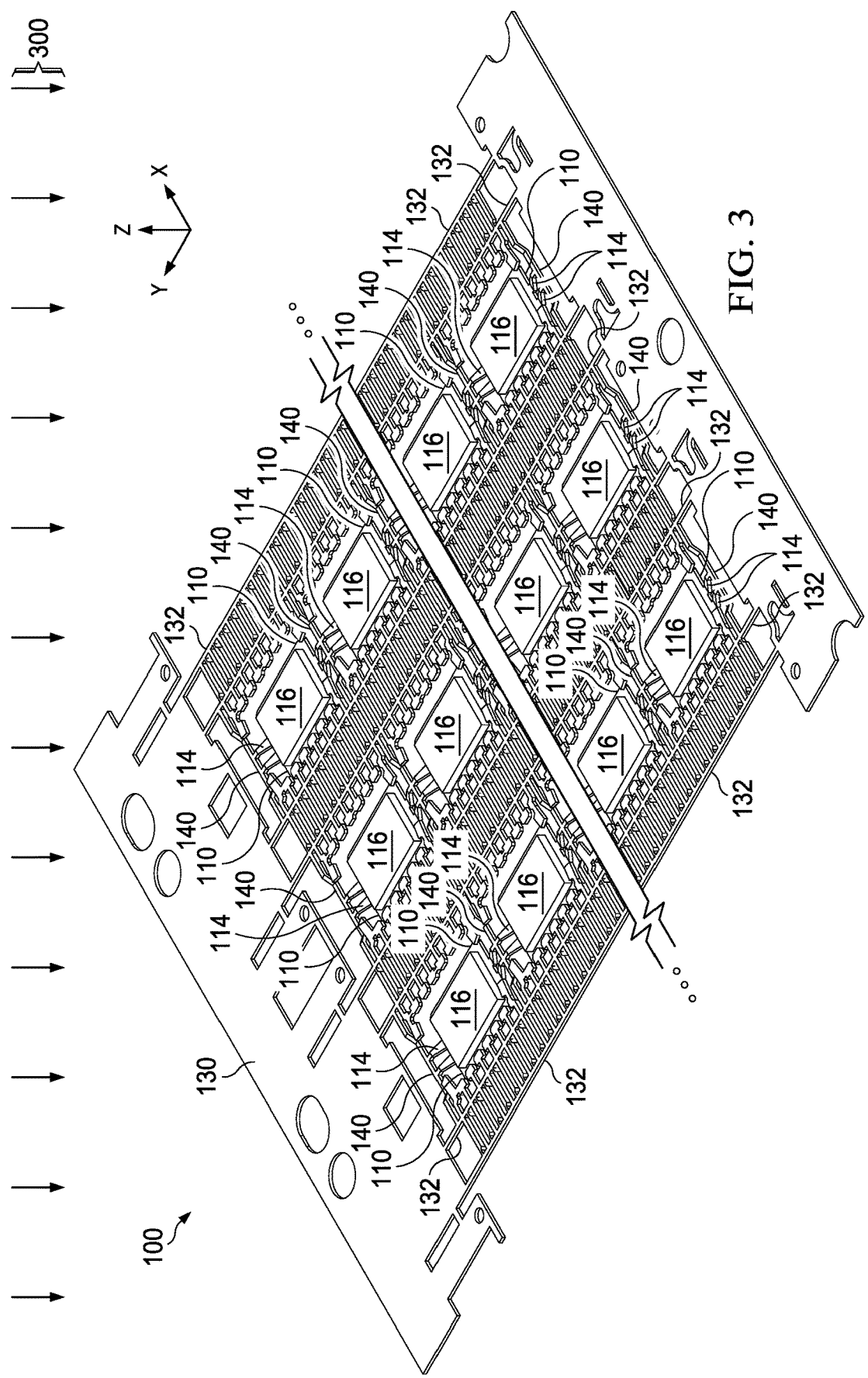
FIGS. 3-10 are perspective and sectional side elevation views of the packaged electronic device of FIG. 1 undergoing fabrication processing according to the method of FIG. 2.

The method 200 continues with die attach processing at 204. FIG. 3 is one example in which a die attach process 300 is performed that attaches the semiconductor die 116 to the respective conductive (die attach) pad 110 in each section of the starting lead frame 130. At this point in the fabrication process, the starting lead frame 130 includes dual level (e.g., three-dimensional or 3D) tie bars 114 and connecting bars 140 as described above in connection with FIGS. 1B-1D. In this example, moreover, the individual segments are positioned in columns and rows, where adjacent columns are offset from one another by 1 lead pitch distance as shown in FIG. 3 to facilitate high density fabrication and enhance the number of produced devices per starting lead frame sheet or strip. The starting lead frame 130 in this example includes unbent leads 111 and 112, interleaved between one another for adjacent segments to improve device density in the array of segments.

The die attach process 300 can use any suitable adhesive attachment materials and steps, such as adhesive epoxy, soldering, etc. In one example, the starting lead frame 130 has an array with multiple sections that respectively correspond to a finished electronic device, and multiple sections may be processed concurrently. Automated dispensing equipment is used to dispense solder flux onto portions of the top sides of the respective conductive pads 110, and a pick and place system is used to position the semiconductor dies 116 on the respective conductive pad locations as shown in FIG. 3. The lead frame 130 including the unbent leads 111 and 112 and the conductive pads 110 initially constitutes a unitary copper structure formed by suitable stamping operations, which may include features at different levels as in the illustrated example 130. In one example, the starting lead frame 130 includes one or more support arms 132 that support the conductive pads 110 by connection to the dual level connecting bars 140 and the dual level tie bars 114 that connect to and initially support respective ones of the conductive pads 110. Such support arm or arms 132 can be connected to portions of the lead frame 130 to support the conductive pads 110 during and after manufacturing or can be removed during manufacturing. In another example, the conductive pads 110 are supported relative to the unbent lead portions 111 and 112 using an adhesive carrier or tape (not shown).

Figure 2:
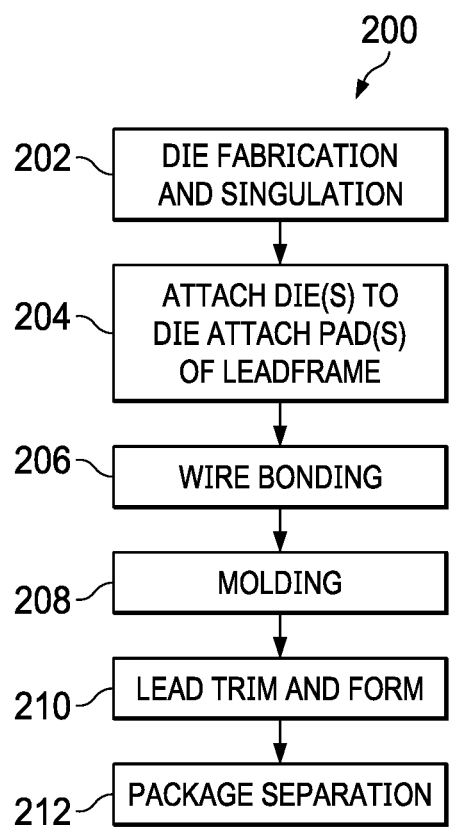
FIG. 2 is a flow diagram of a method of manufacturing a packaged electronic device.
Figure 4:
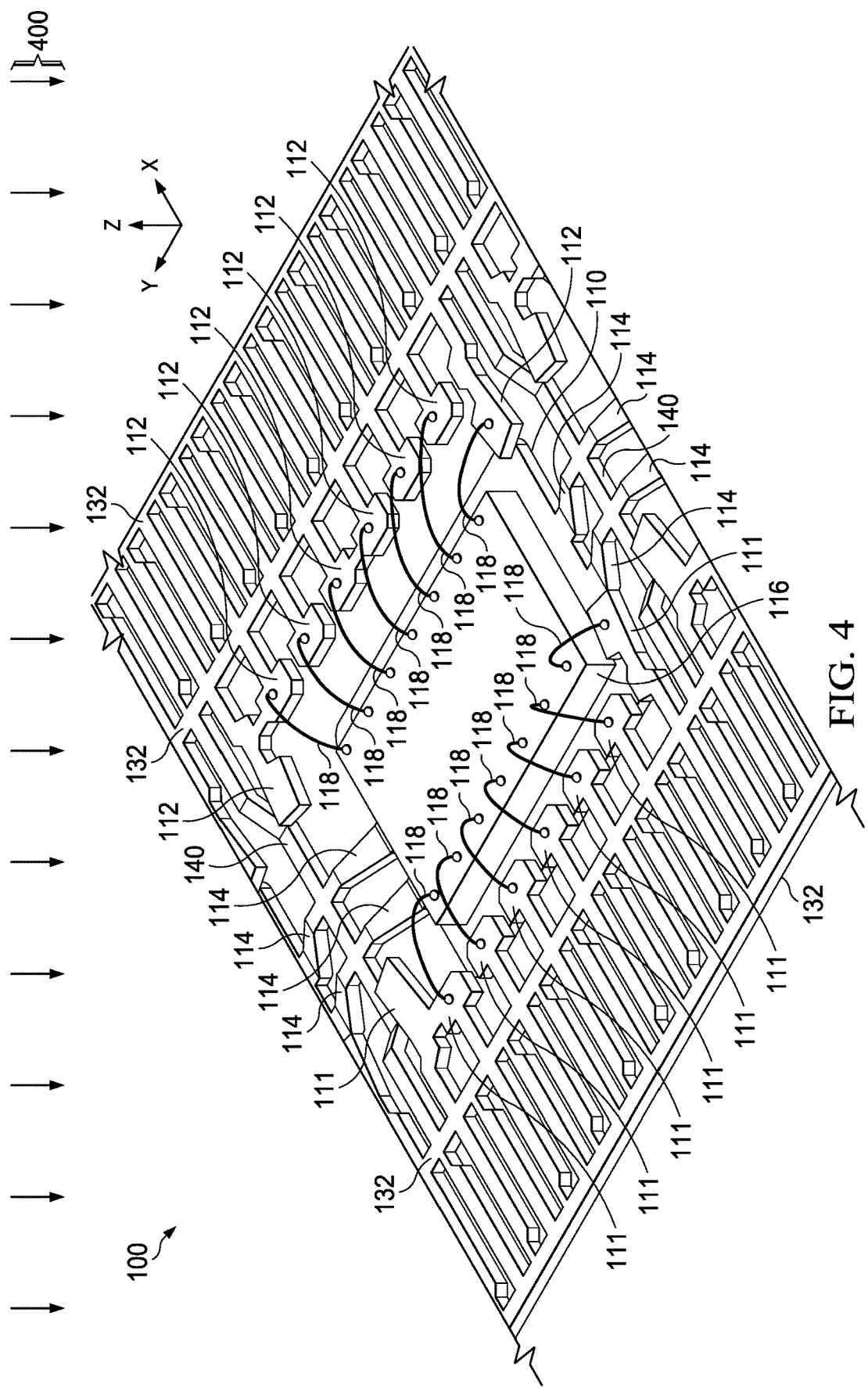

The method 200 continues at 206 in FIG. 2 with an electrical interconnection process, such as wire bonding, that electrically connects conductive features of the respective semiconductor dies 116 to leads 111, 112 of the associated lead frame of the individual lead frame segments. FIG. 4 shows one example where a wire bonding process 400 is performed that forms electrical connections by bond wires 118.

Figure 5:
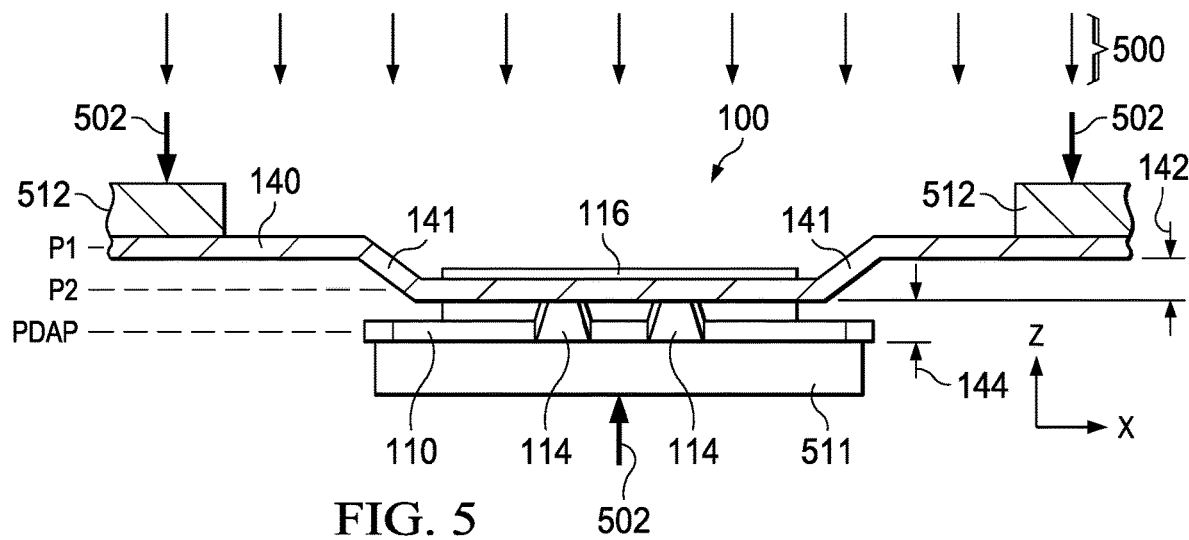
Figure 6:
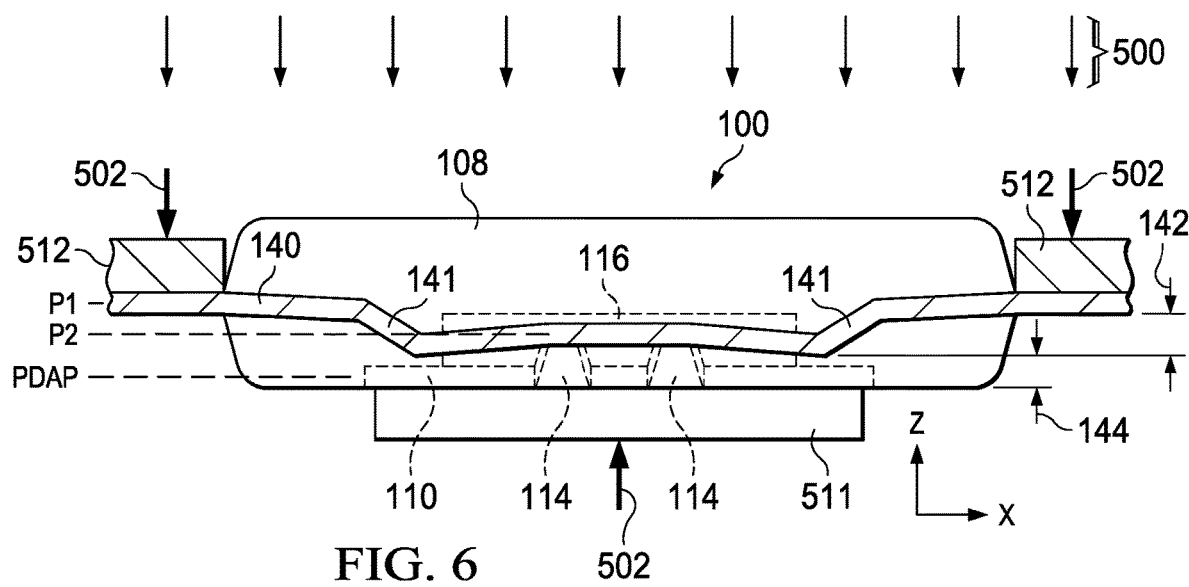
Figure 7:
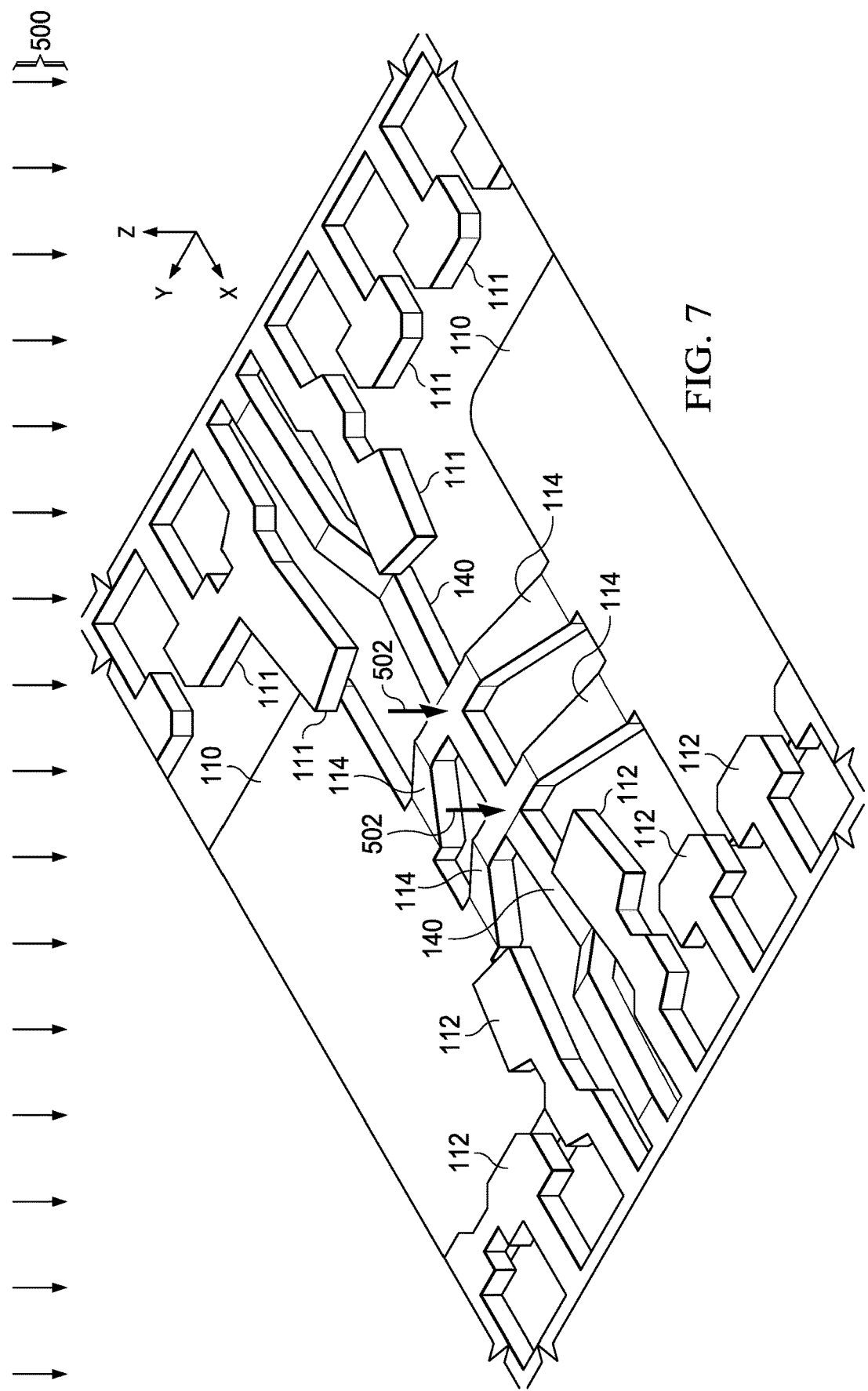

At 208 in FIG. 2, a molding operation is performed to form a package structure. FIGS. 5-7 show one example in which the packaged electronic device 100 of each lead frame segment undergoes a molding process 500 that forms the respective package structure 108. In one example, the molding process 500 forms the respective package structures 108 having the sides 101-106 shown and described above. In another example, individual mold cavities extend along entire columns of the array of lead frame segments, in which the lateral sides 103 and 104 are defined by the molding process and the ends or sides 105 and 106 are defined or formed at package separation that separates neighboring package structures 108 of the individual columns.

As shown in FIGS. 5 and 6, the molding process 500 uses a mold with a lower portion 511 and an upper portion 512 that move relative to one another along the first direction Z and apply a closure force in the direction of arrows 502 in FIG. 5 of individual cavities for each associated lead frame segment. The molding process 500 compresses and deforms the connecting bar 140 of the lead frame 130. FIG. 5 shows initial engagement of the lower and upper mold portions 511 and 512 prior to deformation of the connecting bar 140. FIG. 6 shows the molding process 500 with the mold completely closed and the upper mold portions 512 lowered along the direction of the arrows 502. The dual level structures of the connecting bar 140 and the tie bar 114 oppose the force of the mold closure along the first direction Z, and one or both of the connecting bar 140 and the tie bar 114 are compressed and deformed as shown in FIGS. 6 and 7. The molding process 500 creates the mold parting line 120, 122 of the package structure 108 as shown in FIG. 1 above.

Figure 8:
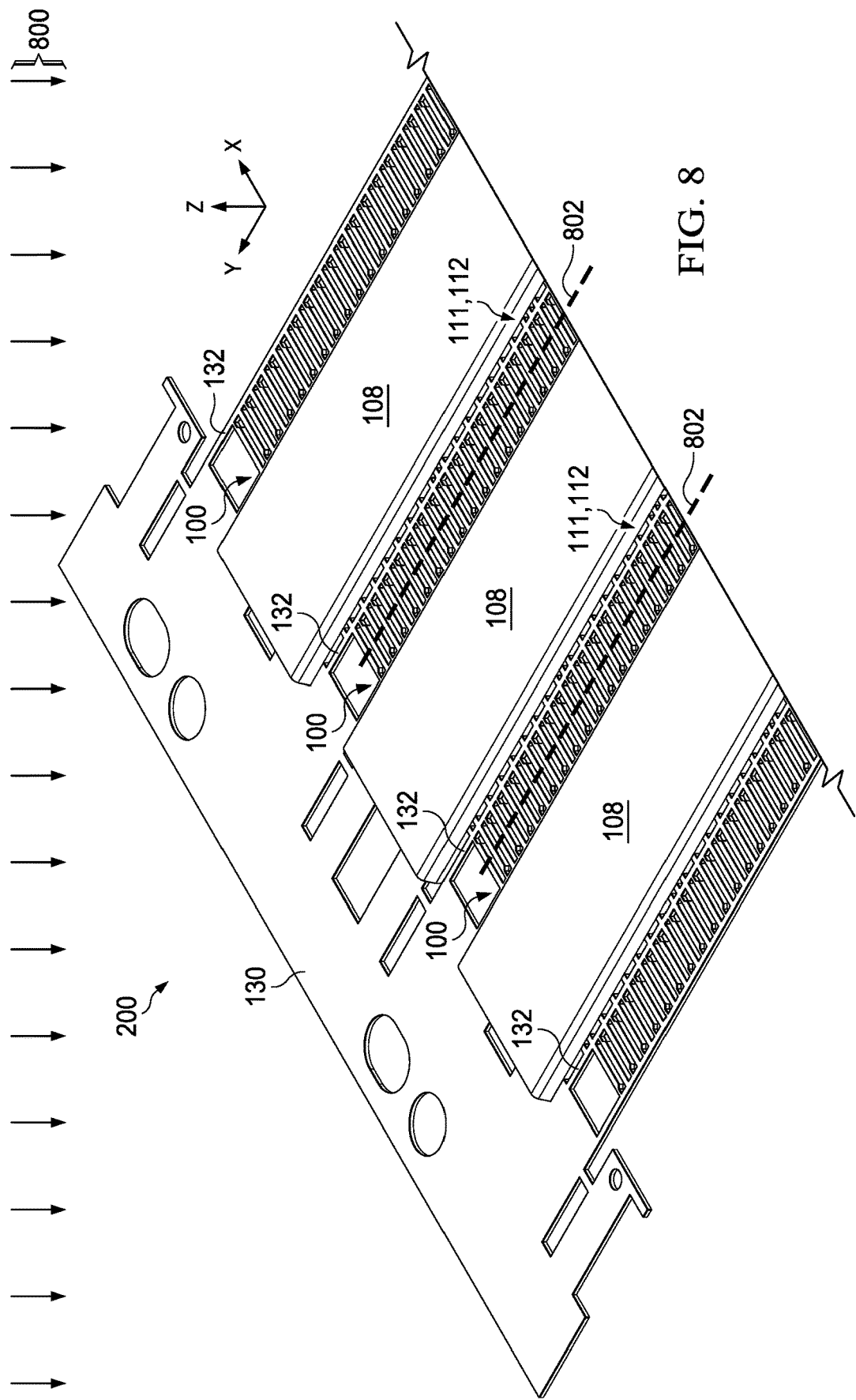

In one example, the method 200 also includes lead trimming and forming at 210. During the molding at 208, dam bar features (not shown) mitigate or prevent outflow of molding material, after which the dam bar features are removed at 210. In one example, the lead trimming includes performing a stamping or cutting process 800 as shown in FIG. 8 that separates portions of the interleaved leads 111 and 112 along lines 802 in the third direction Y and removes copper dam bar features between the lead locations of a repeating lead pitch pattern. The trimming process 800 in one example also removes interconnecting portions of the support arms 132 to provide separated, unbent leads 111 and 112.

Figure 9:
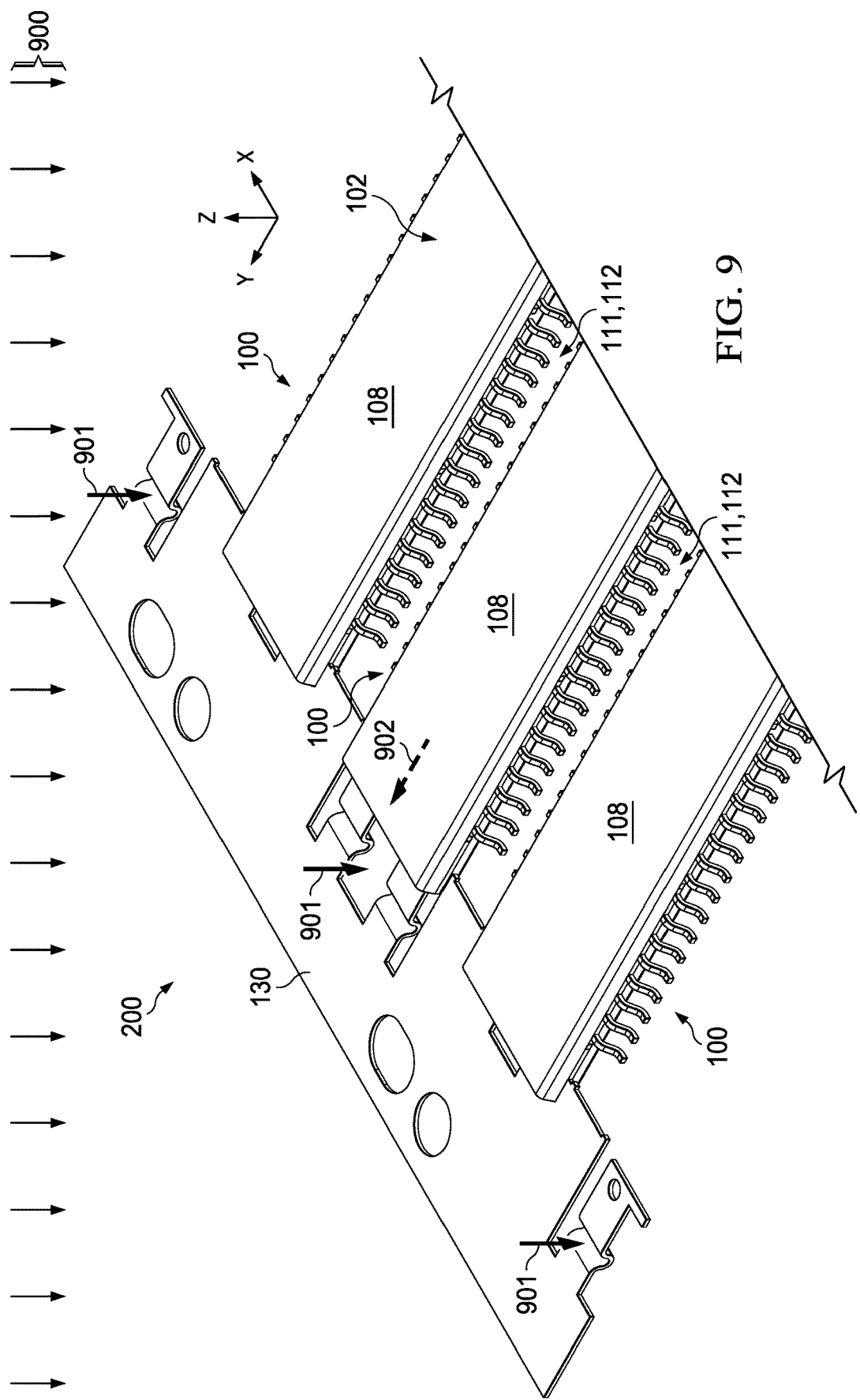

The lead trimming and forming at 210 also includes forming the separated leads 111 and 112, for example, using dies and other tooling to bend or otherwise form external portions of the trimmed leads 111 and 112 into non-planar shapes, such as the gull wing forms shown in FIG. 1 above. FIG. 9 shows one example, in which a forming process 900 forms the leads 111 and 112 downward and outward to provide gull wing leads 111 and 112 extending outward from the respective third and fourth sides 103 and 104 of the individual package structures. In the interleaved example of FIG. 9, the process 900 also includes tooling that deforms, or indents select portions of the lead frame conductive structure along the direction of arrows 901. This deformation or indentation causes odd-numbered columns to move upward by 1 lead pitch length along the directions of lines 902 in FIG. 9 and aligns the leads of the devices 100 of adjacent columns.

Figure 10:
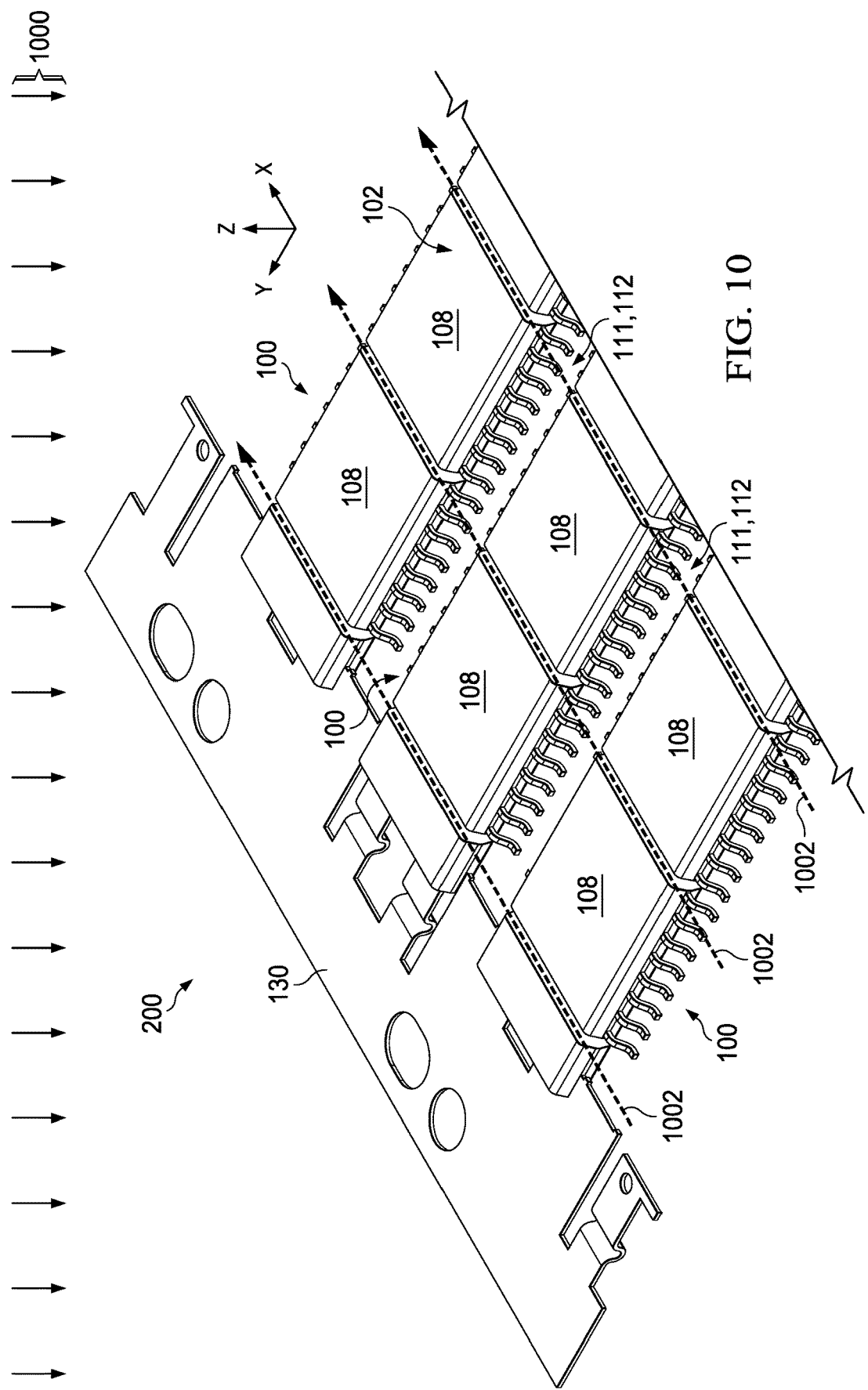

The method 200 further includes package separation at 212 for example, by saw or laser cutting. FIG. 10 shows one example, in which a package separation process 1000 is performed that cuts through the conductive lead frame structure and portions of the molded package structures 108 along lines 1002 of the second direction X. The cutting process 1000 separates packaged electronic devices 1000 from one another and exposes the ends of the tie bars 114 along the ends of sides 105 and 106 of the package structure 108. The resulting packaged electronic device 100 is shown in FIGS. 1 and 1A above.

The dual level tie bars 114 and connecting bars 140 provide a spring force that mitigates or prevents mold leakage and mold flash on the bottom side of the conductive pads 110. The connecting bars 140 and the tie bars 114 are positioned along the ends of the individual packaged electronic devices 100 and the associated sections of the starting lead frame 130 to provide opposing spring force and controlled deformation during the molding processing. The illustrated and described examples mitigate mold flashing while ensuring proper spacing between the leads 111 and 112 for voltage withstand specifications to mitigate arc flashing. An alternate approach to combatting mold flash involves forming tie bars between neighboring leads on the sides 103 and 104 of the starting lead frame 130 to provide mechanical support for the die attach pad during fabrication. However, that approach may violate pin to pin voltage specifications as a portion of the tie bar extends between leads and is connected to the die attach pad. Moreover, the location of the tie bars 114 at the ends of the finished packaged electronic devices facilitates the use of compact interleaved lead frames 130 without adding cost or complexity to the manufacturing process or tooling. The multi-level lead frame strip or panel 130 with dual level connecting bars 140 and tie bars 114 provides a self-biasing spring force to clamp the tie bar 114 instead of the mold die clamp force and mitigates or prevents mold flash during fabrication without impacting pin to pin voltage spacing specifications.

Modifications are possible in the described examples, and other implementations are possible, within the scope of the claims.

What is claimed is:

1. A packaged electronic device, comprising:
   a package structure having a first side, a second side, a third side, a fourth side, a fifth side and a sixth side, the second side spaced from the first side along a first direction, the fourth side spaced from the third side along a second direction, the second direction orthogonal to the first direction, the sixth side spaced from the fifth side along a third direction, and the third direction orthogonal to the first and second directions;
   first leads extending outward in a first plane of the second and third directions from respective portions of the third side and spaced from one another along the third direction, wherein the first plane is parallel to and apart from the first side by a first distance;
   second leads extending outward in the first plane from respective portions of the fourth side and spaced from one another along the third direction;
   a conductive pad; and
   a tie bar connected to the conductive pad, the tie bar including a portion that is exposed from the package structure along the fifth side in a second plane, wherein the second plane is parallel to and apart from the first side by a second distance less than the first distance.

2. The packaged electronic device of claim 1, wherein the conductive pad has a first surface exposed along the first side.

3. The packaged electronic device of claim 2, further comprising a semiconductor die mounted to a second surface of the conductive pad and enclosed by the package structure, the second surface of the conductive pad opposite to the first surface of the conductive pad.

4. The packaged electronic device of claim 1, further comprising a second tie bar including a portion exposed along the sixth side in the second plane.

5. The packaged electronic device of claim 1, wherein:
   the second plane is spaced from a mold parting line of the package structure along the first direction; and
   the second plane is between the mold parting line and the first side.

6. The packaged electronic device of claim 1, wherein:
   the portion of the tie bar exposed in the second plane corresponds to a first segment of the tie bar having a first width; and
   the tie bar includes a second segment connected to the conductive pad, the second segment having a second width greater than the first width.

7. The packaged electronic device of claim 1, wherein:
   the package structure includes a mold parting line in the first plane;
   the first leads and the second leads extend outward from the package structure along the mold parting line; and
   the portion of the tie bar exposed along the fifth side in the second plane is apart from the mold parting line.

8. A lead frame, comprising a conductive structure with multiple sections, the respective sections including:
   a die attach pad having opposite sides spaced from one another along a first direction and extending in a die attach pad plane of second and third directions, the first, second and third directions being mutually orthogonal;
   first leads spaced outward along the second direction relative to a first lateral side of the die attach pad and extending in a first plane parallel to the die attach pad plane, the first plane being spaced from the die attach pad plane by a first distance;
   a first support arm extending along the third direction in the first plane connecting the first leads;
   second leads spaced outward along the second direction relative to a second lateral side of the die attach pad opposite the first lateral side and extending in the first plane;
   a second support arm extending along the third direction in the first plane connecting the second leads;
   a connecting bar extending along the second direction connecting the first support arm to the second support arm, the connecting bar including an angled portion extending between the first plane and a second plane parallel to the first plane, the second plane spaced from the die attach pad plane by a second distance less than the first distance; and
   a tie bar extending along the third direction connecting the die attach pad to the connecting bar, the tie bar including a portion extending between the die attach plane and the second plane.

9. The lead frame of claim 8, wherein the connecting bar comprises:
   a support portion extending in the first plane and connected to the first support arm;
   a base portion extending in the second plane and connected to the tie bar; and
   the angled portion connecting the support portion to the base portion.

10. The lead frame of claim 9, wherein the tie bar includes:
    a first segment connected to the base portion of the connecting bar in the second plane; and a second segment connected to the die attach pad in the die attach pad plane.

11. The lead frame of claim 8, wherein the connecting bar comprises:
   a support portion extending in the first plane;
   a base portion extending in the second plane and connected to the tie bar; and
   the angled portion connecting the support portion to the base portion.

12. The lead frame of claim 11, wherein the tie bar includes:
   a first segment connected to the base portion of the connecting bar in the second plane; and
   a second segment connected to the die attach pad in the die attach pad plane.

13. The lead frame of claim 8, wherein the tie bar includes:
   a first segment connected to the connecting bar in the second plane; and
   a second segment connected to the die attach pad in the die attach pad plane.

14. The lead frame of claim 8, wherein the tie bar includes:
   a first segment connected to the connecting bar, the first segment having a first width; and
   a second segment connected to the die attach pad, the second segment having a second width greater than the first width.

15. The lead frame of claim 8, wherein the connecting bar includes:
   a first segment connected to the first support arm, the first segment in the first plane;
   a second segment connected to the tie bar, the second segment in the second plane; and
   a third segment extending between the first plane and the second plane.

16. A method of manufacturing a packaged electronic device, the method comprising:
   attaching a semiconductor die to a die attach pad of a lead frame, the die attach pad extending in a die attach pad plane;
   electrically connecting conductive features of the semiconductor die to leads of the lead frame, the leads extending in a first plane parallel to the die attach pad plane, wherein the first plane is spaced from the die attach pad plane by a first distance; and
   performing a molding process that compresses and deforms a connecting bar of the lead frame, wherein the connecting bar includes:
      a first segment connected to a support arm of the lead frame, the first segment in the first plane;
      a second segment connected to a tie bar of the lead frame, the second segment in a second plane parallel to the first plane, the second plane being spaced from the die attach pad plane by a second distance less than the first distance; and
      a third segment extending between the first plane and the second plane;
   the molding process includes:
      positioning a first portion of a mold contacting a first surface of the first segment of the connecting bar, the first surface facing away from the die attach pad;
      positioning a second portion of the mold contacting a second surface of the die attach pad, the second surface facing away from the connecting bar; and
      applying a closure force using the first and second portions of the mold such that the connecting bar is compressed and deformed in response to applying the closure force; and
   the molding process forms a package structure that encloses the semiconductor die and interior portions of the leads.

17. The method of claim 16, further comprising:
   performing a trimming processes that trims the leads of the lead frame; and
   performing a package separation process that separates packaged electronic devices from one another and exposes the tie bar of the lead frame along a side of the package structure, wherein the tie bar is connected to the die attach pad and extends between the die attach pad plane and the second plane.

18. The method of claim 17, wherein:
   the package structure includes a first side, a second side, a third side, a fourth side, a fifth side and a sixth side, the second side spaced from the first side along a first direction, the fourth side spaced from the third side along a second direction, the second direction orthogonal to the first direction, the sixth side spaced from the fifth side along a third direction, and the third direction orthogonal to the first and second directions;
   the die attach pad plane includes the second and third directions;
   a first set of the leads extends outward in the first plane from respective portions of the third side;
   a second set of the leads extends outward in the first plane from respective portions of the fourth side; and
   the tie bar is exposed along the fifth side in the second plane.

19. The method of claim 17, wherein:
   the molding process creates a mold parting line of the package structure;
   the leads of the lead frame extend outward from the package structure at least partially along the mold parting line; and
   the tie bar is exposed at a location that is spaced from the mold parting line.

20. The method of claim 16, wherein:
   the package structure includes a first side, a second side, a third side, a fourth side, a fifth side and a sixth side, the second side spaced from the first side along a first direction, the fourth side spaced from the third side along a second direction, the second direction orthogonal to the first direction, the sixth side spaced from the fifth side along a third direction, and the third direction orthogonal to the first and second directions;
   the die attach pad plane includes the second and third directions;
   a first set of the leads extends outward in the first plane from respective portions of the third side;
   a second set of the leads extends outward in the first plane from respective portions of the fourth side; and
   the tie bar of the lead frame is exposed along the fifth side in the second plane.

21. The method of claim 20, wherein:
   the molding process creates a mold parting line of the package structure;
   the leads of the lead frame extend outward from the package structure at least partially along the mold parting line; and
   the tie bar is exposed at a location that is spaced from the mold parting line.

22. The method of claim 16, wherein:
the molding process creates a mold parting line of the package structure;
the leads of the lead frame extend outward from the package structure at least partially along the mold parting line; and
the tie bar of the lead frame is exposed along a side of the package structure at a location that is spaced from the mold parting line.

23. The method of claim 16, wherein the tie bar includes:
a first segment connected to the connecting bar, the first segment having a first width; and
a second segment connected to the die attach pad, the second segment having a second width greater than the first width.

\* \* \* \* \*